(12) United States Patent
Singer

(10) Patent No.: US 7,145,637 B2
(45) Date of Patent: Dec. 5, 2006

(54) ILLUMINATION SYSTEM HAVING A MORE EFFICIENT COLLECTOR OPTIC

(75) Inventor: Wolfgang Singer, Aalen (DE)

(73) Assignee: Carl Zeiss SMT AG, Oberkochen (DE)

(*) Notice: Subject to any disclaimer, the term of this patent is extended or adjusted under 35 U.S.C. 154(b) by 0 days.

(21) Appl. No.: 11/155,213

(22) Filed: Jun. 17, 2005

(65) Prior Publication Data

US 2006/0033895 A1    Feb. 16, 2006

Related U.S. Application Data

(63) Continuation of application No. PCT/EP03/08968, filed on Aug. 13, 2003.

(30) Foreign Application Priority Data

Dec. 19, 2002    (DE) ................ 102 60 077

(51) Int. Cl.
  G03B 27/42    (2006.01)
  G03B 27/54    (2006.01)
(52) U.S. Cl. .......................... 355/53; 355/67
(58) Field of Classification Search ............... 355/53, 355/67; 359/850, 357, 351; 250/492.1; 378/85, 34; 362/551
  See application file for complete search history.

(56) References Cited

U.S. PATENT DOCUMENTS

| | | | |
|---|---|---|---|
| 5,339,346 A | 8/1994 | White | 378/34 |
| 5,361,292 A | 11/1994 | Sweatt | 378/34 |
| 5,512,759 A | 4/1996 | Sweatt | 250/492.1 |
| 5,581,605 A | 12/1996 | Murakami et al. | 378/84 |
| 5,737,137 A | 4/1998 | Cohen et al. | 359/859 |
| 6,285,737 B1 | 9/2001 | Sweatt et al. | 378/75 |
| 6,424,471 B1 | 7/2002 | Ulrich et al. | 359/732 |
| 6,438,199 B1 | 8/2002 | Schultz et al. | 378/34 |
| 6,452,661 B1 | 9/2002 | Komatsuda | 355/67 |
| 6,522,484 B1 | 2/2003 | Schuster | 359/733 |
| 2003/0043455 A1 | 3/2003 | Singer et al. | |

FOREIGN PATENT DOCUMENTS

| | | |
|---|---|---|
| DE | 19903807 A1 | 11/1999 |
| DE | 19855157 A1 | 5/2000 |
| DE | 10020592 A1 | 5/2001 |
| EP | 0939341 A2 | 2/1999 |
| EP | 1225481 A2 | 7/2002 |
| WO | WO 2004/057424 A2 | 7/2004 |

OTHER PUBLICATIONS

International Search Report for PCT/EP03/08968, dated Aug. 17, 2004, 2 pages.

Primary Examiner—Peter B. Kim
(74) Attorney, Agent, or Firm—Ohlandt, Greeley, Ruggiero & Perle, L.L.P.

(57) ABSTRACT

An illumination system having a light source is disclosed, the light source having a source size and emitting radiant power in a spatial angle element $\Omega(\alpha)$, $\alpha$ indicating the aperture angle, a collector, which collects radiant power from the source up to a first maximum aperture angle $\alpha_{max(1)}$, a first geometric flux G1 being defined by the source size Q and the first maximum aperture angle $\alpha_{max(1)}$, a plane to be illuminated having an area A and a numerical aperture NA to be illuminated, the numerical aperture NA to be illuminated defining a second aperture angle $\alpha_{(2)}$, and a second geometric flux G2 being defined by the area A and the second aperture angle $\alpha_{(2)}$, distinguished in that the collector has a first maximum aperture angle $\alpha_{max(1)}$, which is selected in such a way that the first geometric flux G1 is equal to or larger than, particular preferably more than 15% larger than the second geometric flux G2.

18 Claims, 5 Drawing Sheets

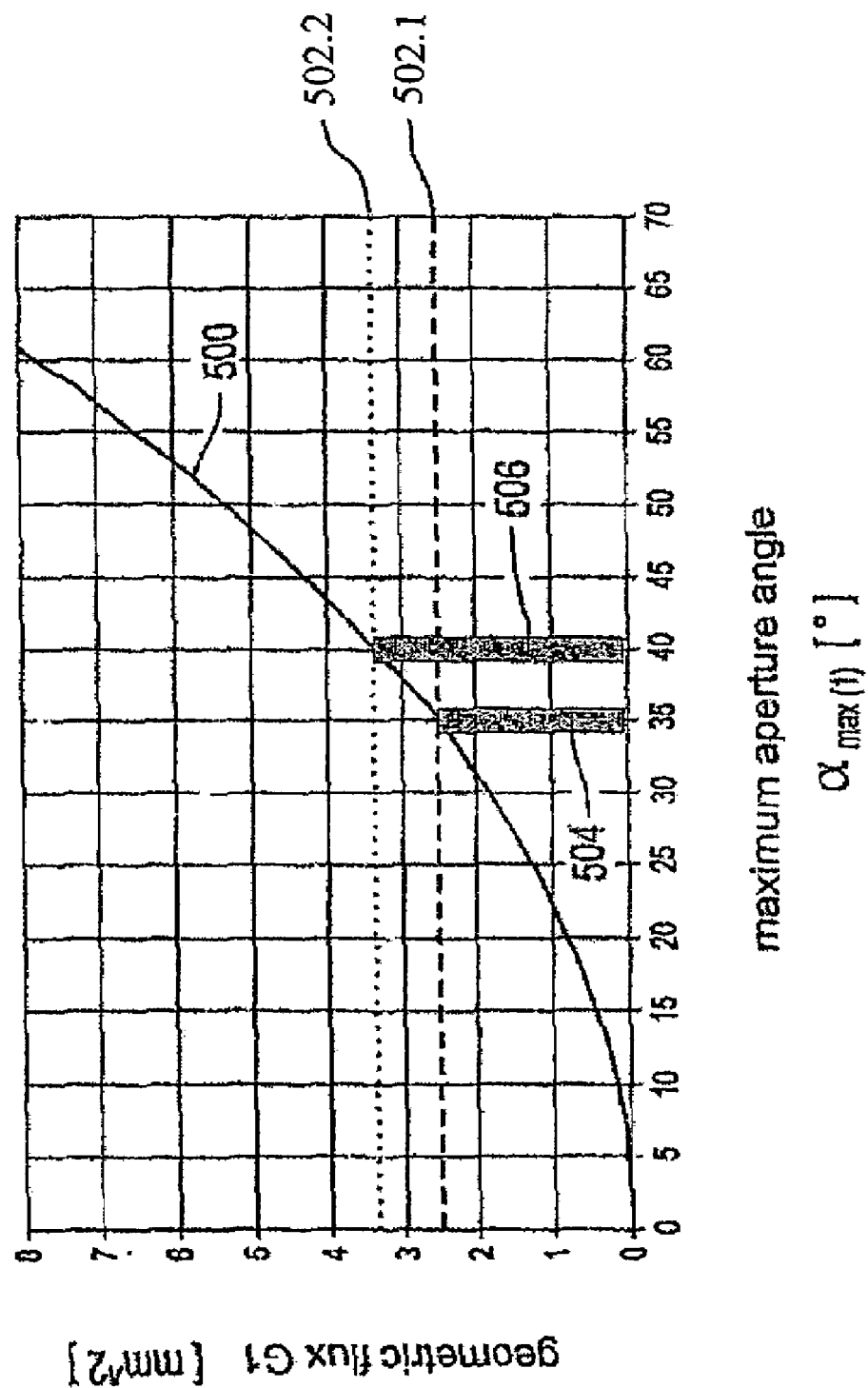

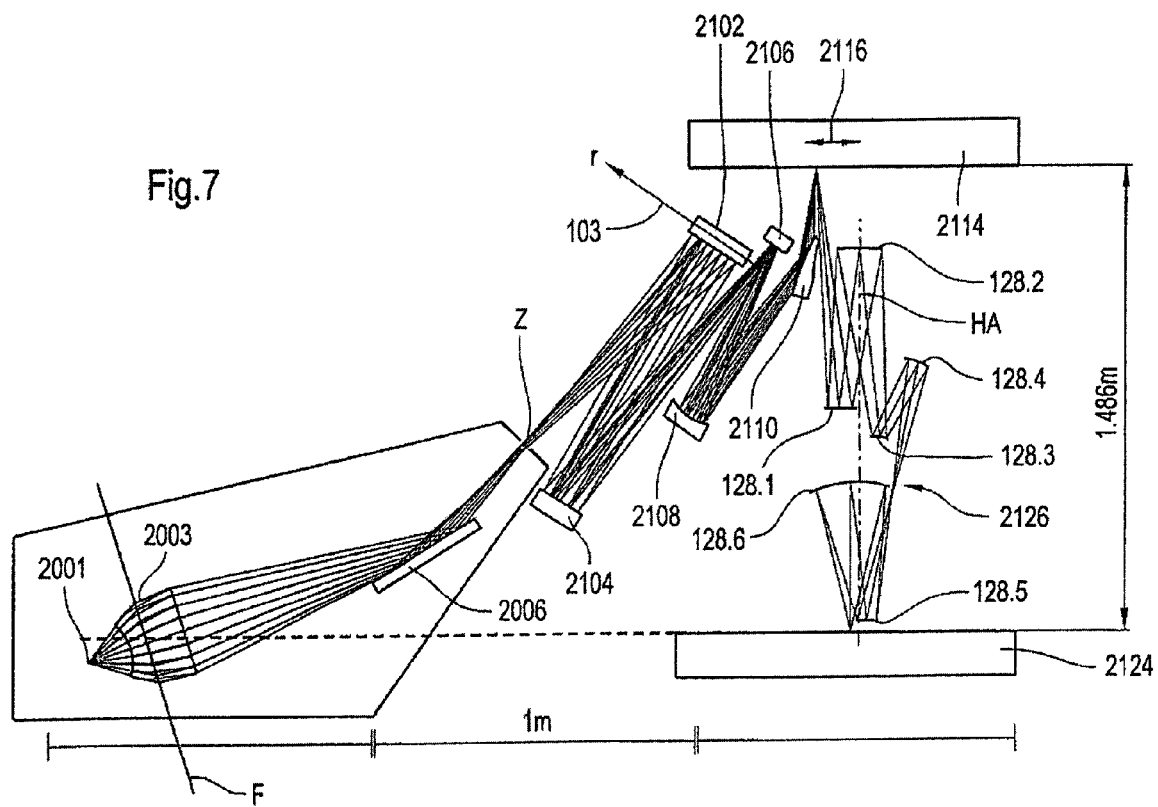

ILLUMINATION SYSTEM HAVING A MORE EFFICIENT COLLECTOR OPTIC

CROSS-REFERENCE TO RELATED APPLICATIONS

The present application is a continuation of PCT/EP03/08968, filed Aug. 13, 2003, the content of which is herein incorporated by reference.

BACKGROUND OF THE INVENTION

1. Field of the Invention

The present invention relates to an illumination system for a projection exposure system having a light source, the light source having a source size Q and emitting radiant power in a spatial angle element $\Omega(\alpha)$, at least one collector, which receives or picks up radiant power from a source up to a first, maximum aperture angle $\alpha_{max(1)}$, a first geometric flux G1 being defined by the source size Q and the first maximum aperture angle $\alpha_{max(1)}$, as well as a plane to be illuminated, which is preferably a reticle plane, in which for example a mask is positioned. The reticle plane has an area A and a numeric aperture NA to be illuminated, the numeric aperture NA defining a second aperture angle $\alpha_{(2)}$ and a second geometric flux being determined by the area A and the second aperture angle $\alpha_{(2)}$.

2. Description of the Related Art

Projection exposure systems for microlithography, particularly for wavelengths $\leq 193$ nm, have become known from multiple applications. Reference is made to German Patent Application 100 20 592 and its counterpart, U.S. Pat. No. 6,424,471 in regard to catadioptric systems and to German Patent 198 55 157 and its US-counterpart U.S. Pat. No. 6,522,484 in regard to refractive systems, the content of whose disclosures are included in their entirety in the present application.

Currently, wavelengths in the range 11–14 nm, particularly 13.5 nm, are discussed as wavelengths for EUV lithography at a numerical aperture of 0.2–0.3. The image quality in EUV lithography is determined by the projection objective and by the illumination system. The illumination system should provide an uniform illumination as far as possible of a field plane, in which the structure-bearing mask, the reticle, is positioned. The projection objective images the field plane in an image plane, the wafer plane, in which a light-sensitive object is positioned. Projection exposure systems for EUV lithography are implemented using reflective optical elements. The shape of the field in the image plane of an EUV projection exposure system is typically that of an annular field having a high aspect ratio of 2 mm (width)× 22–26 mm (arc length). The projection systems are typically operated in scanning mode. Reference is made to the following publications in regard to EUV projection exposure facilities:

W. Ulrich, S. Beiersdörfer, H. J. Mann, "Trends in Optical Design of Projection Lenses for UV- and EUV-Lithography" in Soft-X-Ray and EUV Imaging Systems, W. M. Kaiser, R. H. Stulen (Ed.), Proceedings of SPIE, Vol. 4146 (2000), pp. 13–24, and M. Antoni, W. Singer, J. Schultz, J. Wangler, I. Escudero-Sanz, B. Kruizinga, "Illumination Optics Design for EUV-Lithography" in Soft X Ray and EUV Imaging Systems, W. M. Kaiser, R. H. Stulen (Ed.), Proceedings of SPIE, Vol. 4146 (2000), pp. 25–34, the content of these disclosures are included in their entirety in the present application.

Special illumination systems for EUV projection exposure systems have become known from the following cited publications. Thus, U.S. Pat. No. 5,339,346 discloses an illumination system for a lithography device which uses EUV radiation. For uniform illumination in the reticle plane and filling of the pupil, U.S. Pat. No. 5,339,346 suggests a condenser, which is constructed as a collector lens and includes at least four paired mirror facets, which are positioned symmetrically. A laser plasma light source is used as a light source.

An illumination system having a laser plasma light source, including a condenser mirror, with which illumination of a mask and/or reticle to be illuminated is achieved with the aid of spherical mirrors, is disclosed in U.S. Pat. No. 5,737,137.

U.S. Pat. No. 5,361,292 discloses an illumination system, in which a light source is provided and the point like source is imaged into a ring shaped surface to be illuminated with the aid of a condenser, which has five aspheric mirrors, positioned off-center. The ring shaped illuminated surface is then imaged in the entrance pupil with the aid of a special sequence of grazing-incident mirrors downstream.

An illumination system, in which a photon radiation source is split into multiple secondary light sources with the aid of a honeycomb condenser, is known from U.S. Pat. No. 5,581,605. In this way, uniform illumination in the reticle plane is achieved. The reticle is imaged on the wafer to be exposed with the aid of a typical reduction optic. Precisely one mirror with raster elements having identically curved raster elements as honeycomb condensor is provided in the illumination beam path. In case of U.S. Pat. No. 5,581,605, a laser plasma source or a very small source is assumed.

European Patent Application EP-A-0 939 341 and its US counterpart U.S. Pat. No. 6,452,661 discloses a Koehler illumination system for wavelengths <200 nm, particularly for the EUV range, having a first optical integrator comprising a plurality of first raster elements and a second optical integrator comprising a plurality of second raster elements. A laser plasma source is described as a light source.

A further EUV illumination system, which comprises two mirrors or lenses having raster elements, is known from German Patent Application DE 199 03 807 A1 and its US-counterpart U.S. Pat. No. 6,438,199. These types of systems are also referred to as double faceted EUV illumination systems. The content of the disclosure of this application is included in its entirety in the present application.

The principle of the construction of a double faceted EUV illumination system is disclosed in German Patent Application DE 199 03 807 A1 and its US-counterpart U.S. Pat. No. 6,438,199. The illumination in the exit pupil of the illumination system according to German Patent Application DE 199 03 807 and its US-counterpart U.S. Pat. No. 6,438,199 is determined by the arrangement of the raster elements on the second mirror. A small laser plasma source or a pinch plasma source having a small angle of radiation is again described as a light source.

The content of the disclosures of all applications are included in their entirety in the present application.

Illumination systems as described above have either a laser plasma source having a small dimension or a pinch plasma source, which only radiates in a small spatial angle, as a light source. In both cases, the geometric flux which may be picked up by the collector of an illumination system is therefore limited.

If larger plasma sources, such as discharge plasma sources, are used instead of the light sources described before, too much light is picked up, which cannot be used in the reticle plane to illuminate the structure-bearing mask. If too much light is collected by the collector, an undesired high thermal load arises in the subsequent illumination system and the light collected in excess must be blocked using e.g. diaphragms. On the other hand, if too little light is collected, in a collector which is tailored to the pinch plasma source, for example, too little light is made available to the light-sensitive object in the wafer plane. Furthermore, the high requirements for homogenity of the illumination in the reticle plane cannot be fulfilled.

SUMMARY OF THE INVENTION

The object of the present invention is to indicate an illumination system which overcomes the disadvantages of the prior art. In particular, an illumination system should be provided which is characterized by optimum efficiency and provides high homogeneity of the illumination in the field plane.

The object is achieved by an illumination system having a light source, the light source having a source size and emitting radiant power in a spatial angle element $\Omega(\alpha)$, $\alpha$ indicating the aperture angle. The illumination system includes a collector which receives or picks up radiant power from the source up to a first maximum aperture angle $\alpha_{max(1)}$, a first geometric flux G1 being defined by the source size Q and the first maximum aperture angle $\alpha_{max(1)}$, and a plane to be illuminated having an area A and a numerical aperture NA to be illuminated, the numerical aperture NA to be illuminated defining a second aperture angle $\alpha_{(2)}$, and a second geometric flux G2 being determined by the area A and the second aperture angle $\alpha_{(2)}$. According to the present invention, the collector is designed in such a way that a first maximum aperture angle $\alpha_{max(1)}$ is selected such that the first geometric flux G1 is equal to or larger than, particularly preferably more than 15% larger than the second geometric flux G2.

The merit of the inventor is to have recognized how, particularly in spatially extended plasma light sources, the collection angle and/or aperture angle $\alpha_{max(1)}$ of the collector must be selected so that an optimum efficiency is achieved with simultaneous optimum performance of an illumination system.

Spatially extended plasma light sources, as described in German Patent 101 34 033 and its counterpart WO 2002082871, for example, may be discharge plasma sources. Another extended laser plasma light sources, is, described in U.S. Pat. No. 6,307,913, for example.

The quantity of light which may be received by the illumination system and made available for exposure of the structure-bearing mask in the reticle plane is limited by the beam density of the source and the geometric flux of the illumination optic.

In this case, the geometric flux is given by $$G = \int_A \int_\Omega dA\cos\alpha \cdot d\Omega, \quad (1)$$

the integration extending over the area A to be illuminated in the field plane and the spatial angle $\Omega$ to be illuminated. The aperture angle a describes the angle between the local surface normals and the principal ray of the solid angle in this case. This geometric flux is maintained in optical systems, i.e., is constant.

In the illumination system according to the present invention, a specific geometric flux G1 of the light source is picked up by the collector. The geometric flux G1 is determined by the source size and the aperture angle $\alpha_{max(1)}$. If the collector has central shading, there is a minimum aperture angle $\alpha_{min(1)}$. The maximum and minimum aperture angles then determine an solid angle or spatial angle $\Omega$ with maximum aperture NA 1.

The geometric flux G2 of the overall illumination system is determined in the field plane of the illumination system by the area $A=X\times Y$ to be illuminated and the aperture to be illuminated with maximum numeric aperture $\sigma\beta NA$, $\sigma$ corresponding to the degree of coherence, NA to the maximum aperture in the image plane of the projection objective, and $\beta$ to the imaging scale of the projection optics. The following equation applies:

$$G2 = X \cdot Y \cdot \pi (\sigma \cdot \beta \cdot NA)^2. \quad (2)$$

If a rectangular illumination $A=X\times Y$ is assumed, for example, with X=104 mm, Y=8 mm, a coherence factor a in the range $\sigma=0.5$–$0.8$, $\beta=0.25$ as the imaging scale for the projection objective, and a numeric aperture NA in the image plane of the projection objective which lies in the range NA=0.25–0.3, then the exemplary values from Table 1 result for the geometric flux and/or the light conductance, which is also referred to as the etendue, and for the light conductance increased by 30% (etendue+30%):

TABLE 1

|  | Example A | Example B |
|---|---|---|
| $\sigma \times$ NA | 0.5 × 0.25 | 0.8 × 0.3 |
| geometric flux | 2.55 mm$^2$ | 9.41 mm$^2$ |
| geometric flux + 30% | 3.3 mm$^2$ | 12.23 mm$^2$ |

In the following, it is shown with reference to an example how the maximum aperture angle $\alpha_{max(1)}$ and, for a nested collector having central shading, the minimum aperture angle $\alpha_{min(1)}$ must be selected in order to provide a collector according to the present invention.

If one assumes a light source, for example an EUV light source, having a typical extension in the range of 1 mm to a few millimeters and a source density distribution of the source, which, for example, has approximately the shape of a Gaussian distribution function, as the limiting envelope of the surface at which the source density has fallen to half of the maximum source density, then one obtains a source distribution approximately in the shape of a rotational ellipsoid having length L=2a and diameter D=2b, a and b indicating the half widths of the ellipsoid, in accordance with the typical nomenclature. For this shape of the source, the geometric flux may be represented by $$G1 = 2\pi^2 b^2 \int_{\sin\alpha} \sin\alpha \cdot \sqrt{1 + \frac{a^2}{b^2}\tan^2\alpha} \cdot d\sin\alpha \quad (3)$$

$\alpha$ corresponding to the aperture angle and the integration being performed over the sine of the aperture angle, i.e. sin $\alpha$, i.e., the integration constant is d sin $\alpha$. If the collector is based on a nested collector, for example, like that in European Patent Application EP 1225481 A2 and its US-counterpart U.S. 2003/0043455 A1, the content of whose disclosure is included in its entirety in the present application, the nested collector has a maximum aperture angle $\alpha_{max(1)}$ and, due to the central shading, a minimum aperture angle $\alpha_{min(1)}$. The integration is therefore to be performed from $\alpha_{min(1)}$ to $\alpha_{max(1)}$ and, after integration, the following expression is obtained for the geometric flux G1:

$$G1 = 2\pi^2 b \left[ \frac{a^2}{e} \arctan\left(\frac{\sqrt{b^2 + a^2 \tan^2 \alpha}}{e}\right) - \frac{\sqrt{b^2 + a^2 \tan^2 \alpha}}{1 + \tan^2 \alpha} \right]_{\alpha_{min}}^{\alpha_{max}} \quad (4)$$

with $$e = \sqrt{a^2 + b^2}.$$

According to the present invention, the collector is designed in such a way that a maximum collection angle $\alpha_{max(1)}$ is selected so that a collected geometric flux G1 is greater than or equal to G2, preferably not greater than, for example, 300% of G2, i.e., G1<3×G2, preferably not greater than 200%, i.e., G1<2×G2, and particularly preferably not even greater than, for example, 130% of G2, i.e., G1<1.3× G2. Under these conditions, the power emitted by the source may be used optimally. An illumination system having optimal efficiency, and therefore also optimal thermal management, results.

Of course, as in a nested collector for uniform illumination of a plane, the received or picked up aperture of the radiation emitted from the source may have gaps in the radial direction. In this case, the picked up geometric flux is determined from a summation using inner and outer aperture angles $\alpha^i_{min}$ and $\alpha^i_{max}$ of the respective shell numbers i of the collector having N shells to $$G1 = \sum_{i=1}^{N} G1(i) = \sum_{i=1}^{N} \pi^2 b \left[ \frac{a^2}{e} \arctan\left(\frac{\sqrt{b^2 + a^2 \tan^2 \sigma}}{e}\right) - \frac{\sqrt{b^2 + a^2 \tan^2 \alpha}}{1 + \tan^2 \alpha} \right]_{\alpha^i_{min}}^{\alpha^i_{max}} \quad (5)$$

For the sake of simplicity, in the following the case is considered in which the collector picks up a continuous aperture range from $\alpha_{min}$ to $\alpha_{max}$. This is possible, since the slight shading between the shells only causes a slight geometric light loss, which is compensated by a slightly greater light absorption of approximately 30%, for example.

For the example A of Table 1, one obtains a collection angle of approximately 35.5°<$\alpha_{max}$<39.5° for a source having ellipse half parameters a=1.2 mm and b=0.8 mm. If the source is given by the ellipse half parameters a=1.5 mm and b=0.65 mm in example B of Table 1, an ideal collection angle 69°<$\alpha_{max}$<78.3° is obtained. At these maximum collection angles according to the present invention, optimum performance is achieved for the predetermined sources with minimum thermal load in the Illumination system at the same time.

In the examples described above, $\alpha_{min(1)}$ is always equal to 0. However, the collected geometric flux only changes by 0.1 mm² due to slight central shading of the collector aperture of, for example, $\alpha_{min}$ of approximately 9°, in the case of the larger source and example B. This corresponds to approximately 1% of the geometric flux which may be received in example B. Therefore, this slight difference may be disregarded in the consideration, it plays a comparatively small role in relation to the geometric flux to be received, which is preferably at least 30% greater.

If one considers a normal incidence collector, as is described in European Patent Application EP 0 939 341 A1 and its US-counterpart U.S. Pat. No. 6,452,661, for example, the content of whose disclosure is included in its entirety in the present application, the following flux G1 results, a collection aperture of up to NA~1 being assumed for this collector, as in European Patent Application EP 0 939 341 A1. For a collector of this type having a collection aperture of, for example, NA=1, a geometric flux G1 is picked up for a source shaped like a rotational ellipsoid, which is given by $$G1 \approx b\pi^2 \left( b + \frac{a^2 \pi}{2e} - \frac{a^2}{e} \arctan\left(\frac{b}{e}\right) \right) \quad (6)$$

with the parameter e as defined in formula (4).

For a source having half parameters of a=1.2 mm and b=0.8 mm, one therefore obtains a geometric flux G1 of approximately G1=16.7, which is significantly greater than G1=2.55 for example A previously shown having a nested collector, as is disclosed in European Patent Application EP 1225481 A2, for example, if the aperture angles $\alpha_{min(1)}$ and $\alpha_{max(1)}$ are selected according to the present invention. In this case, using a collector having a numeric aperture of NA~1, i.e., an picked up source aperture of +/−90°, 6.5 times the usable source power would be collected and reflected by such a collector. This means, that of the collected and reflected radiation approximately 5.5 shares would have to be blocked or absorbed in the illumination system if such a collector is used in EUV illumination system. This would lead to a significant thermal load, which additionally may accelerate the destruction of mirror surfaces as a function of the light power. In addition, the design of the illumination system may be made more difficult if the source power picked up is too great. It is therefore advantageous to select the collection aperture of the collector so that a maximum of 300% of the usable geometric flux G2 is picked up, particularly preferably even only 130%.

Of course, even a normal incidence collector or, at other wavelengths, a refractive collector, which only receives radiant power from the source in the range of the aperture angle according to the present invention, is conceivable for one skilled in the art.

In the case of the collector described in European Patent Application EP 0 939 341 A1 with NA~1, the excess power absorbed leads to a significant thermal load in the illumination system.

BRIEF DESCRIPTION OF THE DRAWING

In the following, the present invention is to be described for exemplary purposes with reference to the drawing, FIG. 6: shows geometric flux G1 as a function of the maximum aperture angle $\alpha_{max(1)}$ FIG. 7: shows a projection exposure system according to the present invention.

DESCRIPTION OF THE INVENTION

Figure 1:
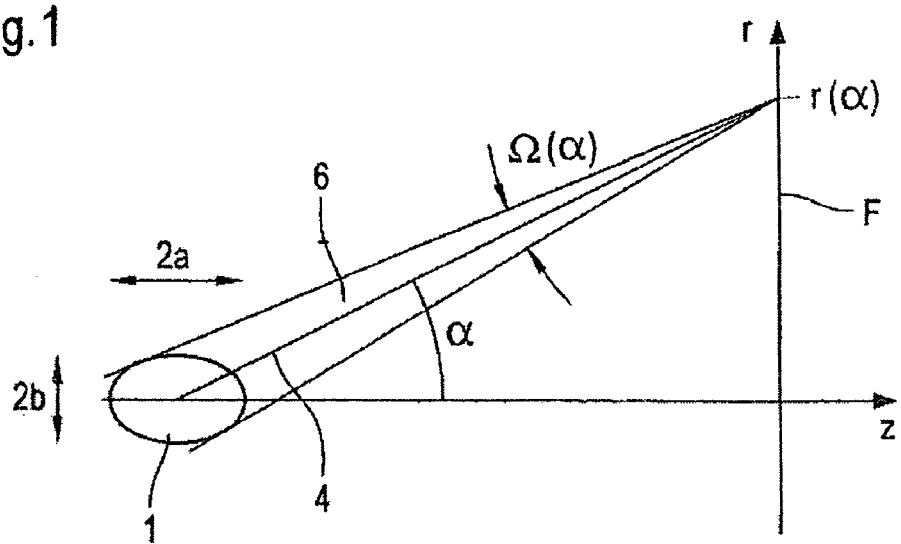
FIG. 1: shows an illustration of the geometric flux of a source shaped like a rotational ellipsoid.

In FIG. 1, the geometric flux G1 through an area F of the radiation emitted by a light source shaped like a rotational ellipsoid is shown. The rotationally-symmetric light source 1 is positioned on the z-axis. The area F is perpendicular to this z-axis, at a distance to the light source 1. At each height $r(\alpha)$ of the area F, beams of a beam bundle 6 from the light source 1 are only incident in a spatial angle $\Omega(\alpha)$, which is tilted by the angle $\alpha$. The size of the spatial angle $\Omega(\alpha)$ is a function of the height $r(\alpha)$ and/or of the angle $\alpha$, and of the ellipse half parameters a and b, which in turn define the light source.

As previously shown, $$G1 = 2\pi^2 b^2 \int_{\sin\alpha} \sin\alpha \cdot \sqrt{1 + \frac{a^2}{b^2}\tan^2\alpha} \cdot d\sin\alpha$$

applies for the geometric flux, the integration being performed over the sine of the angle $\alpha$ to the optical axis and in which:

a, b: ellipse parameters
$\alpha$: aperture angle.

Figure 2:
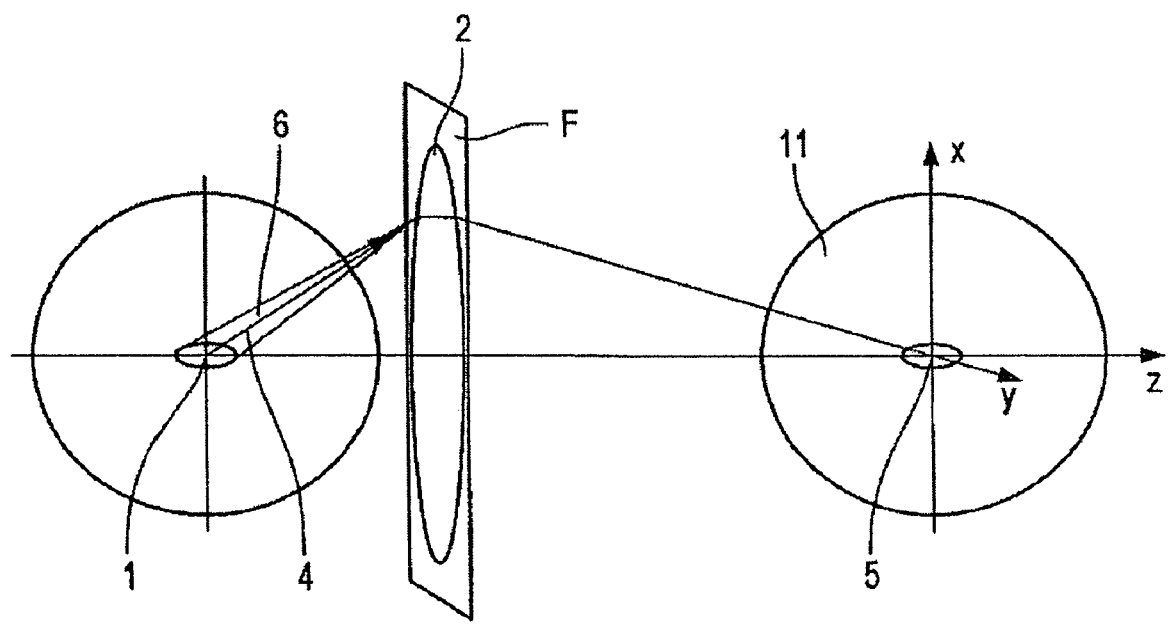
FIG. 2: shows a schematic drawing of an illumination system having a collector.

As shown In FIG. 2, a spatial angle $\Omega(\alpha)$ is picked up by collector 2 from each point of the extended light source 1. The aperture angle $\alpha$ is determined by the tilt of the principal ray 4 of the light bundle 6 picked up or collected by e. g. the collector, in relation to the z-axis.

FIG. 2 shows a schematic drawing of a system having light source 1, collector 2, source image 5, and area F, which is necessary in order to determine the geometric flux G1 which is generated by the source and received by the collector. The light source 1 emits a specific radiant intensity into the space.

The collector 2 collects the emitted light and bundles it. It images the light source 1. into a light source image 5. The light source image 5 can be either real—as illustrated in FIG. 2—or virtual. The light source 1 may also already be an image of a physical light source.

An arbitrary light source 1 is imaged in an image of the source. The source image may be real (i.e., in the light direction to the right of the collector 2) or virtual (i.e., in the light direction to the left of the collector 2), or lie in infinity.

Figure 3:
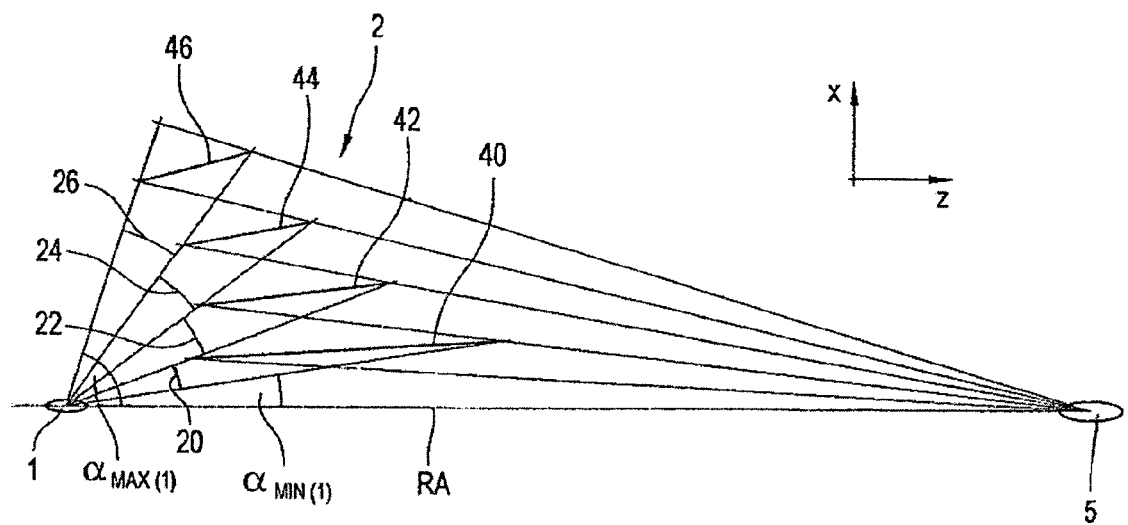
FIG. 3: shows a schematic drawing of a reflective nested collector.

A nested collector having four mirror shells is shown as an example in FIG. 3. The mirror shells are ellipsoid segments which are positioned rotationally symmetric around the axis of rotation RA, which is coincident with the z-axis in the present case. Due to the rotational symmetry around the z-axis, only half of the collector 2 is illustrated in section.

Figure 4:
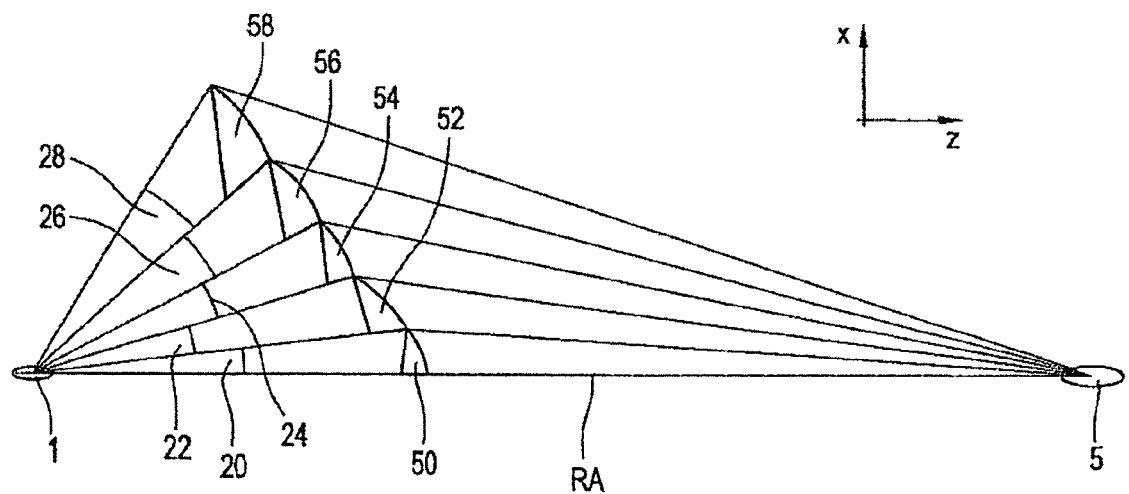
FIG. 4: shows a schematic drawing of a refractive nested collector.

The four mirror shells 40, 42, 44, 46 are positioned approximately equidistant from the z-axis, which relates to the maximum shell diameter. In FIG. 4, the light source 1, the area F, and the source image 5 are also shown.

Furthermore, the angular aperture elements 20, 22, 24, and 26 picked up by each mirror shell are shown.

The reference numbers of the other elements correspond to those in the preceding figures.

Nested, reflective collectors necessarily have central shading, i.e., below a specific aperture angle $\alpha_{min(1)}$, the radiation of the source 1 may not be collected. This radiation is therefore preferably blocked using a diaphragm, so that it may not reach the subsequent illumination system. The diaphragm may, for example, be positioned in the region of the collector.

A similar arrangement may also be conceived for refractive systems. In refractive systems, the nested mirror shells 40, 42, 44, 46 are replaced by annular off-axis segments of lenses 50, 52, 54, 56, as shown in FIG. 4.

FIG. 4 schematically shows an arrangement of annular off-axis segments of lenses. Only half of the system, which is rotationally symmetric around the axis of rotation RA, which is coincident with the z-axis, is schematically illustrated in section, Unequally large angular elements are deflected on equally large height segments and therefore, for example, a homogeneous illumination is achieved, even with anisotropic source radiation. Identical reference numbers as in the preceding figures indicate identical elements.

Figure 5:
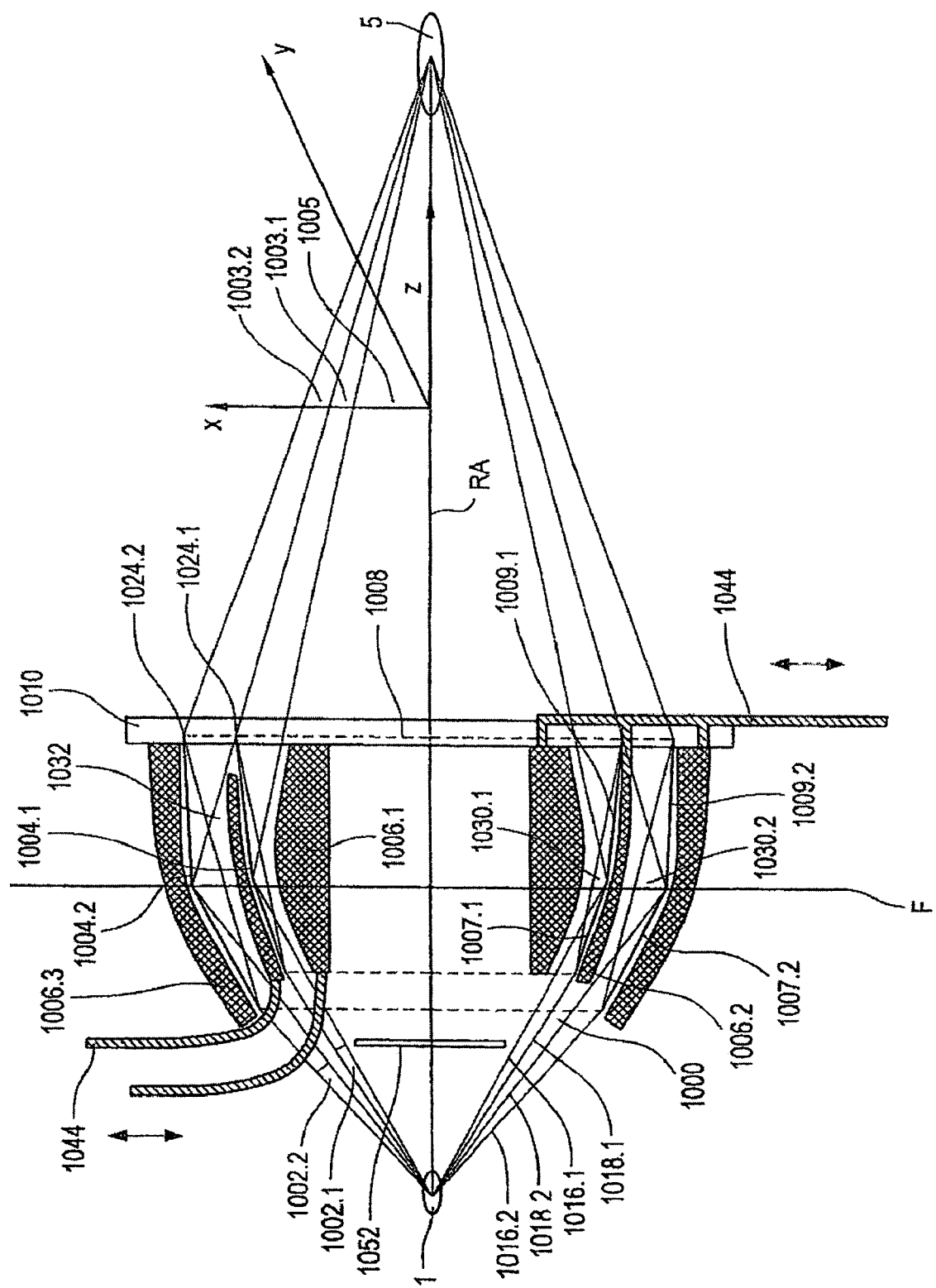
FIG. 5: shows a nested reflective collector having gaps

FIG. 5 shows a further embodiment of a nested collector having, for example, two mirror shells 1004.1, 1004.2 positioned one inside the other, in which the ring aperture elements, via which the light of the light source 1 is received by the collector, have a gap 1000 between the object-side ring aperture elements 1002.1 and 1002.2 of the first mirror shell 1004.1 and the second mirror shell 1004.2. The image-side ring elements 1003.1, 1003.2 directly adjoin one another, so that in the image space, i.e., the plane to be illuminated on the image side, there is no gap except for the necessary central shading 1005. In the collector illustrated, cooling devices 1006.1, 1006.2, 1006.3 are positioned in the unused region between the two mirror shells 1004.1, 1004.2 and inside and outside the collector. The mirror shells 1004.1, 1004.2 approximately end in a plane 1008 and are held in this plane 1008 by a spoked wheel, for example, of which one spoke 1010 is shown. Each mirror shell 1004.1, 1004.2 of the embodiment illustrated comprises two mirror segments, a first mirror segment 1007.1, 1007.2 having a first optical surface and a second mirror segment 1009.1, 1009.2 having a second optical surface, which are positioned one behind the other without gaps. The first mirror segments 1007.1, 1007.2 are segments of hyperboloids in the present exemplary embodiment and the second mirror segments 1009.1, 1009.2 are segments of ellipsoids.

As may be clearly seen in the meridional section shown in FIG. 5, the inner and outer edge beams 1016.1, 1016.2, 1018.1, 1018.2 of the respective mirror shell and/or the connection lines assigned thereto between the source 1, the image of the source 5, the shell ends 1024.1, 1024.2 and, in systems having two mirror segments, also the transition region between the first mirror segment 1007.1, 1007.2 and the second mirror segment 1009.1, 1009.2, define an optically used region or a beam pipe, through which the radiant flux from the object and/or from the light source 1 flows to the image 5 of the light source. A meridional section or a meridional plane is the plane which includes the axis of rotation RA, which is coincident with the z-axis. An unused region 1032 thus lies between the used regions 1030.1, 1030.2 of at least two mirror shells 1004.1, 1004.2 positioned one inside the other.

Further components of the nested collector may be positioned in the unused region 1032 between two mirror shells 1004.1, 1004.2 without influencing the radiant flux from the light source 1 to the image of the light source 5. Examples of components of this type would be detectors or output mirrors which deflect light onto detectors or non-optical components such as heat shields or cold traps. The cooling devices 1006.1, 1006.2, 1006.3 may be in direct contact with the backs of the collector shells. The arrangement of electrodes or magnets for deflecting charged or magnetic partides is also possible. Electrical lines or lines for supplying and removing coolant may be guided in the image-side plane, still outside the collector, with only slight shading of the image-side collector aperture, i.e., of the illuminated region in the image-side plane. These lines 1044 are preferably guided in the region of the shadows of the spokes 1010 of the spoked wheel having spokes 1010. The spoked wheel is aligned in the x-direction, i.e., perpendicular to the scanned direction, in the present case. The shells of the nested collector itself are rotationally symmetric around the axis of rotation z. Of course, further cooling elements or detectors may also be positioned in regions outside the outermost shell 1004.2 or the central shading 1052. A diaphragm may also preferably be positioned in the region of the central shading.

For the picked up geometric flux G1 of a nested collector of this type having gaps, with a light source having a source distribution of the shape of a rotational ellipsoid, the picked up geometric flux results from a summation with inner and outer aperture angle $\alpha^i_{min}$ and $\alpha^i_{max}$ of the respective shell numbers i of the collector having N shells to $$G1 = \sum_{i=1}^{N} G1(i) = \sum_{i=1}^{N} \pi^2 b^2 \left[ \frac{a^2}{e} \arctan\left( \frac{\sqrt{b^2 + a^2\tan^2\alpha}}{e} \right) - \frac{\sqrt{b^2 + a^2\tan^2\alpha}}{1+\tan^2\alpha} \right]_{\alpha^i_{min}}^{\alpha^i_{max}}$$

for all N shells.

In FIG. 6, the picked up or collected geometric flux G1 is shown as a function of the maximum aperture $\alpha_{max(1)}$ for light source 1 having half parameters a=1.2 mm and b=0.8 mm and a source distribution in the shape of a rotational ellipsoid. The geometric flux G1 as a function of the maximum aperture angle is indicated with 500 in FIG. 5. The equation $$G1 = 2\pi^2 b^2 \int_{\sin\alpha} \sin\alpha \cdot \sqrt{1 + \frac{a^2}{b^2}\tan^2\alpha} \cdot d\sin\alpha,$$

indicated in the introductory part is used as the basis.

In FIG. 6, which is to be understood merely as an example of the principle according to the present invention, the integration was performed from the minimum aperture $\alpha_{min(1)}=0$ up to aperture $\alpha_{max(1)}$. The curve may hardly be differentiated from a collector having central shading with, for example, a minimum aperture angle $\alpha_{min}$ of approximately 9°, since the received geometric flux is only approximately 0.15 mm² up to this aperture angle.

The dashed horizontal line 502.1 in FIG. 6 indicates the geometric flux for the entire illumination system, which is determined in the field plane of the illumination system by the area A=X×Y to be illuminated and the aperture to be illuminated having maximum numeric aperture σβNA, σ corresponding to the degree of coherence, NA to the maximum aperture in the image plane of the projection objective, and β to the imaging scale of the projection optic. The following equation applies:

$$G2 = X \cdot Y \cdot \pi(\sigma \cdot \beta \cdot NA)^2.$$

The horizontal line 502.1 represents the geometric flux G2 for an illumination system having a rectangular illumination A=X×Y with X=104 mm, Y=8 mm, G×NA=0.5×
0.25, and β=0.25, The geometric flux or the etendue is 2.55 mm² for this purpose. As may be clearly seen, the geometric flux G1 of the source reaches the geometric flux G2 of the illumination system at a collection angle of ~35°. According to the present invention, the maximum aperture angle $\alpha_{max(1)}$ selected is greater than ~35°, but preferably not greater than ~40°. The limit 40° for $\alpha_{max(1)}$ results from the requirement, that the flux G1 is not more than 130% of the flux G2, in order to keep the thermal load in the illumination system low and/or avoid unnecessary thermal loads. The horizontal line 502.2 designates the geometric flux of 1.3 G2. The limits of the range for the maximum angle $\alpha_{max}$, which result from the requirement G2<G1<1.3 G2, are indicated with the reference numbers 504 and 506. The lower limit of $\alpha_{max(1)}$~35° is designated by reference number 504 and the upper limit of ~40° by reference number 506.

In the above consideration, the field to be illuminated in the field plane, in which the mask is positioned, is assumed to be a rectangular field. The field shape may be arbitrary, and particularly may be a circular arc. For one skilled in the art, the calculation of the geometric flux G2 results for field shapes of this type without having to deviate from the present invention. The calculation of the area included by area A is than merely performed in accordance with the field shape, for example, for a field shaped like a circular arc, the area A is given by:

$$A = \frac{\gamma}{360°}\pi(r_{max}^2 - r_{min}^2)$$

in which
γ: angle of curvature of the field shaped like a circular arc
$r_{max}$: maximum radius of the circular arc field, for example, $r_{max}$=134 mm,
$r_{min}$: minimum radius of the circular arc field, for example, $r_{min}$=126 mm.

However, the embodiments shown are only examples for the present invention, other well-known refractive embodiments or combinations of reflective and refractive collectors and condensers are applicable in an obvious way for one skilled in the art.

FIG. 7 shows a schematic view of a projection exposure system for the production of microelectronic components, for example, in which the present invention may be applied.

The projection exposure system shown in FIG. 7 comprises a light source 2001, as well as a nested collector 2003 having a plurality, for example, 7 or 8 shells, for collecting or receiving the geometric flux from the light source. The construction of the collector is shown in principle in FIGS. 4 and 6. The planar mirror 2006 in the beam path between the nested collector and in front of the intermediate focus Z may be implemented as a spectral filter having an angle of diffraction of 2° between 0 and the order of diffraction used. This is followed by an optical system, as is already known to one skilled in the art as a reflective or refractive honeycomb condenser from U.S. Pat. No. 2,183,249, for example. The first optical element 2102 includes, for example, 122 first raster elements of the shape of the field each having an extension of 54 mm×2.75 mm. The second optical element 2104 has 122 second raster elements, assigned to the first raster elements, of the shape of the light source, each having a diameter of 10 mm. The optical elements 2106, 2108, and 2110 are essentially used for the purpose of forming the field in the field plane 2114. A structured mask (not shown), which is imaged using a projection objective 2126 on the object in the plane 2124 to be exposed, is positioned in the object plane and/or field plane 2114. In principle, the illumination system is a doubly faceted illumination system as disclosed in U.S. Pat. No. 6,198,793 B1, the content of which is included in its entirety in the present application.

It is a characteristic of optical systems in general and also for honeycomb condensers in particular that they leave the geometric flux invariant and/or at most slightly elevate it through scattering or diffraction. Through the layout of the rotationally-symmetric collector, which generates a rotationally-symmetric light flux, and a first optical element 2102, comprising first rectangular or curved raster elements, a light loss arises at the first optical element through the geometric irradiation of the rectangular or curved first raster elements using an essentially round illumination. This light loss is compensated in the layout of the collector aperture according to the present invention by absorbing a geometric flux which is only, for example, up to 30% greater, without excessively increasing the thermal load in the illumination system at the same time.

The system is laid out for a field radius of 130 mm at an illumination aperture of NA=0.03125 in the object plane 2114, i.e., on the reticle, corresponding to a degree of filling of σ=0.5 in the entrance pupil E of a subsequent 4:1 projection objective having an aperture NA=0.25 in the plane 2124 of the object to be exposed. The reticle may be moved in the direction 2116 shown in the projection exposure facility, which Is laid out as a scanning system.

The exit pupil of the illumination system is illuminated largely homogeneously. The exit pupil is coincident with the entrance pupil of the following projection objective 2126. The entrance pupil is at the location of the intersection of the main beam reflected from the reticle with the optical axis HA of the projection objective.

The projection objective 2126 comprises, for example, six mirrors 2128.1, 1128.2, 2128.3, 2128.4, 2128.5, 2128.6 in accordance with the U.S. patent application Ser. No. 09/503,640 and images the reticle in the object plane 2114 on the object 2124 to be exposed. The disclosure content of this application is fully incorporated by reference in this application.

Through the extension of the collector 2003 according to the present invention, which picks up a geometric flux G1, which is equal to or larger than, preferably more than 15% larger than, but particularly preferably not more than 30% larger than the second geometric flux G2, the thermal load of the projection exposure facility is reduced. Diaphragms, which are particularly positioned in the region of the optical elements 2106, 2108, and 2110 in exposure systems according to the related art in order to fade out the excess power collected, are no longer necessary.

Simultaneously, the geometric light losses which typically occur in an illumination system are compensated by the collector according to the present invention having the selected collection aperture corresponding to a geometric flux greater than the geometric flux necessary in the field plane, the collector according to the present invention being laid out, however, so that the thermal load is minimal with optimum efficiency of the illumination system.

What is claimed is:

1. An illumination system comprising:
a light source that emits radiant power in a spatial angle element $\Omega(\alpha)$, wherein $\alpha$ indicates an aperture angle, and wherein said light source has a density distribution having a shape;
a collector that collects said radiant power up to a first maximum aperture angle $\alpha_{max(1)}$, a first geometric flux G1 being defined by said shape and said first maximum aperture angle $\alpha_{max(1)}$;
a plane to be illuminated having an area A and a numerical aperture NA, wherein said numerical aperture NA defines a second aperture angle $\alpha_{(2)}$; and
a second geometric flux G2 being defined by said area A and said second aperture angle $\alpha_{(2)}$,
wherein said first geometric flux G1 is more than 15% greater than said second geometric flux G2.

2. The illumination system according to claim 1, wherein said first geometric flux G1 is less than 300% of said second geometric flux G2.

3. The illumination system according to claim 1, wherein said collector comprises a plurality of rotationally-symmetric mirror shells positioned one inside another around a common axis of rotation.

4. The illumination system according to claim 1, wherein said collector has a central shading and a first minimum aperture angle $\alpha_{min(1)}$ assigned thereto.

5. The illumination system of claim 1, wherein said collector is a normal incidence collector.

6. The illumination system of claim 1, wherein said light source is a discharge plasma source.

7. A projection exposure system comprising:
(a) the illumination system of claim 1, for illuminating a mask positioned in or near said plane; and
(b) a projection objective for imaging said mask on a light-sensitive object.

8. The illumination system of claim 1, wherein said first geometric flux G1 is less than 200% of said second geometric flux G2.

9. The illumination system of claim 1, wherein said first geometric flux G1 is less than 130% of said second geometric flux G2.

10. The illumination system according to claim 1, wherein said shape has a first dimension and a second dimension.

11. The illumination system according to claim 10, wherein said first dimension has a value of 2a, wherein said second dimension has a value of 2b, and wherein a and b are half widths of a ellipsoid.

12. An illumination system comprising:
an extended light source that emits radiant power in a spatial angle element $\Omega(\alpha)$, wherein a indicates an aperture angle, and wherein said light source has a density distribution having a shape;
a collector that collects said radiant power up to a first maximum aperture angle $\alpha_{max(1)}$, wherein said collector includes a plurality of rotationally-symmetric mirror shells positioned one inside another around a common axis of rotation;
a plane to be illuminated having an area A and a numerical aperture NA, wherein said numerical aperture NA defines a second aperture angle $\alpha_{(2)}$;
a first geometric flux G1 being defined by said shape and said first maximum aperture angle $\alpha_{max(1)}$; and
a second geometric flux G2 being defined by said area A and said second aperture angle $\alpha_{(2)}$,
wherein said first geometric flux G1 is more than 15% greater than said second geometric flux G2, and
wherein said collector has a central shading and a first minimum aperture angle $\alpha_{min(1)}$ assigned thereto.

13. The illumination system of claim 12, wherein said first geometric flux G1 is less than 300% of said second geometric flux G2.

14. The illumination system of claim 12, wherein said first geometric flux G1 is less than 200% of said second geometric flux G2.

15. The illumination system of claim 12, wherein said first geometric flux G1 is less than 130% of said second geometric flux G2.

16. The illumination system of claim 12, wherein said light source is a discharge plasma source.

17. A method comprising:
(A) illuminating a mask with light from an illumination system that includes:
   a light source that emits radiant power in a spatial angle element $\Omega(\alpha)$, wherein $\alpha$ indicates an aperture angle, and wherein said light source has a density distribution having a shape;
   a collector that collects said radiant power up to a first maximum aperture angle $\alpha_{max(1)}$, a first geometric flux G1 being defined by said shape and said first maximum aperture angle $\alpha_{max(1)}$;
   a plane to be illuminated having an area A and a numerical aperture NA, wherein said numerical aperture NA defines a second aperture angle $\alpha_{(2)}$; and
   a second geometric flux G2 being defined by said area A and said second aperture angle $\alpha_{(2)}$,
   wherein said first geometric flux G1 is more than 15% greater than said second geometric flux G2; and
(B) imaging said mask onto a light-sensitive object to produce a microelectronic component.

18. A projection exposure system comprising:
(a) an illumination system having:
   an extended light source that emits radiant power in a spatial angle element $\Omega(\alpha)$, wherein $\alpha$ indicates an aperture angle, and wherein said light source has a density distribution having a shape;
   a collector that collects said radiant power up to a first maximum aperture angle $\alpha_{max(1)}$, wherein said collector includes a plurality of rotationally-symmetric mirror shells positioned one inside another around a common axis of rotation;
   a plane to be illuminated having an area A and a numerical aperture NA, wherein said numerical aperture NA defines a second aperture angle $\alpha_{(2)}$;
   a first geometric flux G1 being defined by said shape and said first maximum aperture angle $\alpha_{max(1)}$; and
   a second geometric flux G2 being defined by said area A and said second aperture angle $\alpha_{(2)}$,
   wherein said first geometric flux G1 is more than 15% greater than said second geometric flux G2; and
(b) a projection objective, wherein said illumination system is for illuminating a mask positioned in or near said plane, and wherein said projection objective is for imaging said mask on a light-sensitive object.

* * * * *